United States Patent
Baba et al.

(10) Patent No.: US 6,344,300 B1
(45) Date of Patent: Feb. 5, 2002

(54) COLOR FILTER, METHOD OF MANUFACTURING COLOR FILTER AND PHOTOSENSITIVE COLORING COMPOSITION

(75) Inventors: Koji Baba; Shigeo Hozumi, both of Toyonaka (JP)

(73) Assignee: Sumitomo Chemical Co., Ltd., Osaka (JP)

(*) Notice: Subject to any disclaimer, the term of this patent is extended or adjusted under 35 U.S.C. 154(b) by 0 days.

(21) Appl. No.: 09/467,781

(22) Filed: Dec. 20, 1999

(30) Foreign Application Priority Data

Mar. 3, 1999 (JP) .......................... 11-055562

(51) Int. Cl.⁷ .................... G02B 5/20; G02F 1/335; G03F 7/033
(52) U.S. Cl. ........................ 430/7; 430/281.1
(58) Field of Search ................ 430/7, 270.1, 281.1; 349/106

(56) References Cited

U.S. PATENT DOCUMENTS

| | | | |
|---|---|---|---|
| 4,983,020 A | | 1/1991 | Nakayama et al. |
| 5,085,937 A | | 2/1992 | Herauf |
| 5,368,976 A | | 11/1994 | Tajima et al. |
| 5,827,626 A | * | 10/1998 | Kobayashi et al. ............ 430/7 |
| 5,916,713 A | * | 6/1999 | Ochiai et al. ................ 430/7 |
| 5,916,714 A | * | 6/1999 | Sato et al. ................... 430/7 |
| 6,010,824 A | | 1/2000 | Komano et al. |

FOREIGN PATENT DOCUMENTS

| | | | |
|---|---|---|---|
| EP | 0564168 A | | 10/1993 |
| EP | 0718694 A | | 6/1996 |
| EP | 0726497 A | | 8/1996 |
| EP | 0758097 A | | 2/1997 |
| EP | 0775941 A | | 5/1997 |
| EP | 0821275 A | | 1/1998 |
| EP | 0875788 A | | 11/1998 |
| JP | 5224014 | | 9/1993 |
| JP | 6-148418 | * | 5/1994 |
| JP | 7306530 | | 11/1995 |
| JP | 7319161 | | 12/1995 |
| JP | 8286387 | | 11/1996 |
| JP | 8292427 | | 11/1996 |
| JP | 1020485 | | 1/1998 |

\* cited by examiner

*Primary Examiner*—John A. McPherson
(74) *Attorney, Agent, or Firm*—Stevens, Davis, Miller & Mosher, L.L.P.

(57) ABSTRACT

A color filter comprising a transparent substrate, a light-shielding layer patterned on said transparent substrate, and colored pixels of plural colors patterned on a portion of said substrate where said light-shielding layer is not formed, wherein said colored pixels of at least one color are formed from a photosensitive coloring composition comprising:

(A) a pigment;

(B) a copolymer of (meth)acrylic acid, as one monomer, and at least one other monomer;

(C) a photopolymerizable monomer;

(D) a photopolymerizable initiator; and (F) a solvent; and an acid value of a nonvolatile component of said photosensitive coloring composition is 25 through 60 mg KOH/g; and after forming the colored pixels from a photosensitive coloring composition, the light-shielding layer attains reflectance at 380 through 780 nm of 95% or more of reflectance thereof before coating the photosensitive coloring composition; and the transparent portion of the substrate attains transmittance at 380 through 780 nm of 99.5% or more of transmittance thereof before coating the photosensitive coloring composition.

7 Claims, 1 Drawing Sheet

COLOR FILTER, METHOD OF MANUFACTURING COLOR FILTER AND PHOTOSENSITIVE COLORING COMPOSITION

BACKGROUND OF THE INVENTION

The present invention relates to a color filter used in a liquid crystal display device or an imaging device and a method of manufacturing the same. Also, the invention relates to a photosensitive coloring composition used in the manufacture of the color filter.

A color filter used in a color liquid crystal display device or an imaging device is generally manufactured by forming pixels of the three primary colors, red, green and blue, on a transparent substrate of glass or the like. Furthermore, a light-shielding layer, a black matrix, is generally formed for shielding light between these pixels. In forming colored pixels by using a photosensitive coloring composition, the photosensitive coloring composition containing a pigment corresponding to each color is uniformly applied on a transparent substrate bearing a pattern of a light-shielding layer with a spin coater or the like, and the resultant is dried by heating (pre-bake). Then, the thus formed coat film is exposed, developed and subjected to post-curing (post-bake). These procedures are repeated with respect to each color necessary for the color filter, resulting in forming pixels of all the colors.

A generally used light-shielding layer has a single layer structure of chromium or a multilayer structure having a chromium layer exposed on the surface and a chromium oxide layer. On a transparent glass substrate bearing such a light-shielding layer, pixels of the colors necessary for a color filter are formed as described above. There is, however, a problem that a development residue mainly derived from a pigment remains on the light-shielding layer and the transparent substrate after development. Such a development residue remaining on the light-shielding layer degrades adhesion between an ITO (transparent electrode) or an over coat (a flattening layer for the color filter), which is stacked on the color filter after forming colored pixels, and the substrate. This development residue also causes peeling on the interface. On the other hand, a development residue remaining on the transparent substrate degrades the color reproducibility because pixels of respective colors are successively formed in the manufacture of the color filter.

In order to remove such a development residue, various methods have been examined. A method for treating with a liquid containing hydrofluoric acid as described in JP-A-5-224014 is known as an improvement process for attaining the purpose. A method for using a specific nonionic surfactant as described in JP-A-8-286387 and a method for using an alkaline aqueous solution including a specific amine and a nonionic surfactant as described in JP-A-8-292487 are proposed for attaining the purpose by an improvement of developper.

Such improvement from the viewpoints of processes and a developer, however, cannot sufficiently remove a development residue. Furthermore, the improvement processes increases cost.

For the purpose of improving disperse stability of a pigment, JP-A-7-306530 discloses a photosensitive solution containing an organic solvent and a disperse resin having an acid value of 20 through 300 mg KOH/g so that the solution obtained by dissolving the disperse resin in the organic solvent can attain viscosity within a specific range. For the purpose of improving photosensitivity and disperse stability of a pigment, JP-A-7-319161 discloses a photosensitive solution that contains a disperse resin having an acid value of 20 through 300 mg KOH/g and an unsaturated equivalent of 600 through 3,000 and has thixotropy within a specific range. In these publications, a development residue remaining after development is not particularly considered. According to examination made by the present inventors, the amount of a development residue cannot be effectively reduced under conditions described in these publications.

Problems to be Solved by the Invention

The present inventors have conducted extensive studies in order to solve the problems of the conventional techniques for reducing the amount of a development residue generated in the manufacture of a color filter. As a result, it was found that the acid value of a nonvolatile component of a photosensitive coloring composition used for forming colored pixels affects the amount of a development residue, and that the amount of a development residue remaining on a light-shielding layer and a transparent portion on a substrate after development can be remarkably reduced by using a composition in which the acid value is adjusted. Thus, the present invention was completed.

An object of the present invention is to provide a color filter in which a minimal amount of development residue remains on a light-shielding layer and a transparent portion on a substrate after development, which can be produced by using a specific photosensitive coloring composition. Another object of the present invention is to provide such a photosensitive coloring composition used for producing a color filter capable of reducing the amount of development residue remaining on a light-shielding layer and a transparent portion on a substrate after development.

SUMMARY OF THE INVENTION

The present invention provides a color filter which comprises a transparent substrate, a light-shielding layer patterned thereon and colored pixels of plural colors patterned on a portion of the substrate where the light-shielding layer is not formed, wherein the colored pixels of at least one color are formed from a photosensitive coloring composition comprising (A) a pigment; (B) a copolymer of (meth)acrylic acid, as one monomer, and at least one other monomer; (C) a photopolymerizable monomer; (D) a photopolymerization initiator; and (F) a solvent, and the acid value of a nonvolatile component of the photosensitive coloring composition is 25 through 60 mg KOH/g. After forming the colored pixels from a photosensitive coloring composition, the light-shielding layer attains reflectance at 380 through 780 nm of 95% or more of reflectance thereof before coating the photosensitive coloring composition; and the transparent portion of the substrate attains transmittance at 380 through 780 nm of 99.5% or more of transmittance thereof before coating the photosensitive coloring composition.

This color filter is manufactured by coating the photosensitive coloring composition on the transparent substrate bearing the light-shielding layer, drying the thus obtained coat film, irradiating the coat film with light through a mask and developing the coat film so as to form the colored pixels. The present invention also provides a photosensitive coloring composition comprising (A) a pigment; (B) a copolymer of (meth)acrylic acid, as one monomer, and at least one other monomer; (C) a photopolymerizable monomer; (D) a photopolymerization initiator; and (F) a solvent, in which an acid value of a nonvolatile component of the photosensitive coloring composition is 25 through 60 mg KOH/g. After forming colored pixels by coating the composition on a transparent substrate bearing a light-shielding layer, drying the coat film and subjecting the dried coat film to pattern exposure and alkaline development, the light-shielding layer attains reflectance at 380 through 780 nm of 95% or more of reflectance thereof before coating the composition, and a transparent portion of the substrate attains transmittance at 380 through 780 nm of 99.5% or more of transmittance thereof before coating the composition.

Figure 1A:
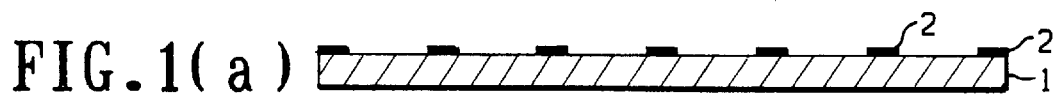
FIG. 1

Sectional views for successively showing procedures of manufacturing a color filter.

Description of Reference Numerals

1—Transparent substrate
2—Light-shielding layer
3, 4, 5—Photomask
11—Dried coat film formed from first photosensitive coloring composition
12—First pixel
13—Dried coat film formed from second photosensitive coloring composition
14—Second pixel
15—Dried coat film formed from third photosensitive coloring composition
16—Third pixel

EMBODIMENT OF THE INVENTION

Pixels of at least one color of the color filter of this invention are formed from a photosensitive coloring composition which comprises (A) a pigment; (B) a copolymer of (meth)acrylic acid, as one monomer, and at least one other monomer; (C) a photopolymerizable monomer; (D) a photopolymerization initiator and (F) a solvent, and has an acid value of a nonvolatile component of 25 through 60 mg KOH/g. This photosensitive coloring composition is generally called as a pigment-dispersed resist, in which the pigment (A) is dispersed in the solvent (F), and the copolymer (B) called as a binder resin, the photopolymerizable monomer (C), the photopolymerization initiator (D) and another additive, if necessary, are further dissolved or dispersed.

The pigment (A) can be an organic pigment or an inorganic pigment generally used in a pigment-dispersed resist. Examples of the inorganic pigment include metal compounds such as a metal oxide and a metal complex. Specifically, oxides and composite oxides of metals such as iron, cobalt, nickel, aluminum, cadmium, lead, copper, titanium, magnesium, chromium, zinc and antimony are listed as the examples. Examples of the organic pigment include compounds classified as pigments in Colour Index (published by The Society of Dyers and Colourists). One of these pigments can be singly used or a combination of two or more of them can be used together. Specific examples thereof include compounds of the following color index (C.I.) numbers, which do not limit the invention:

C.I. pigment yellow: 20, 24, 31, 53, 83, 86, 93, 94, 109, 110, 117, 125, 137, 138, 139, 147, 148, 150, 152, 153, 154, 155, 166, 173, 180 and 185;
C.I. pigment orange: 13, 31, 36, 38, 40, 42, 43, 51, 55, 59, 61, 64, 65 and 71;
C.I. pigment red: 9, 97, 105, 122, 123, 144, 149, 166, 168, 176, 177, 180, 192, 215, 216, 224, 242 and 254;
C.I. pigment violet: 14, 19, 23, 29, 32, 33, 36, 37 and 38;
C.I. pigment blue: 15 (15:3, 15:4, 15:6, etc.), 21, 22, 28, 60 and 64;
C.I. pigment green: 7, 10, 15, 25, 36 and 47;
C.I. pigment brown: 28; and
C.I. pigment black: 1, 7, etc.

The pigment (A) is used preferably in a concentration of 5 through 60 wt % and more preferably 10 through 50 wt % on the basis of the content of all solid components of the photosensitive coloring composition.

The binder resin provides an alkaline developing property to an unexposed coat film and also works as a disperse medium of the pigment. In this invention, (B) the copolymer of (meth)acrylic acid and at least one other monomer is used as the binder resin. In this specification, (meth)acrylic acid indicates acrylic acid or methacrylic acid. Similarly, for example, (meth)acrylate means acrylate or methacrylate. This copolymer (B) is generally obtained through copolymerization of (meth)acrylic acid and at least one other monomer copolymerizable with (meth)acrylic acid. Hence this copolymer (B) has a carboxyl group derived from (meth)acrylic acid.

The other monomer to be copolymerized with (meth) acrylic acid is a monomer copolymerizable with (meth) acrylic acid. It may be a compound having a polymeric carbon-carbon unsaturated bond. Specific examples thereof include aromatic vinyl compounds such as styrene, α-methylstyrene and vinyltoluene; unsaturated carboxylic acid alkyl esters such as methyl (meth)acrylate, ethyl (meth) acrylate, butyl (meth)acrylate, 2-hydroxyethyl (meth) acrylate, and benzyl (meth)acrylate; unsaturated carboxylic acid amino alkyl esters such as amino ethyl acrylate; unsaturated carboxylic acid glycidyl esters such as glycidyl (meth)acrylate; carboxylic acid vinyl esters such as vinyl acetate and vinyl propionate; vinyl cyanide compounds such as (meth)acrylonitrile and α-chloroacrylonitrile; and unsaturated carboxylic acids other than (meth)acrylic acid such as crotonic acid, itaconic acid, maleic acid and fumaric acid. One of these monomers can be singly used or a combination of two or more of them can be used together for copolymerization with (meth)acrylic acid.

Examples of (B) the copolymer of (meth)acrylic acid and at least one other monomer include a (meth)acrylic acid/ benzyl (meth)acrylate copolymer, a (meth)acrylic acid/ benzyl (meth)acrylate/styrene copolymer, a (meth)acrylic acid/methyl methacrylate copolymer, and a (meth)acrylic acid/methyl methacrylate/styrene copolymer. Furthermore, a copolymer of (meth)acrylic acid and at least one other monomer whose side chain is denatured by a compound having a photosensitive group can be used as (B) the copolymer of (meth)acrylic acid and at least one other monomer of this invention.

The copolymer (B) has a weight-average molecular weight, converted as polystyrene, of preferably 5,000 through 400,000, and more preferably 10,000 through 300, 000. The amount of the copolymer (B) is generally 5 through 90 wt. %, preferably 20 through 70 wt %, on the basis of the content of all the solid components of the photosensitive coloring composition.

The photopolymerizable monomer (C) is a compound polymerizable by light and the function of a photopolymerization initiator. Generally, it has at least one polymeric carbon-carbon unsaturated bond. The photopolymerizable monomer (C) can be a monofunctional monomer, a bifunctional monomer or another polyfunctional monomer. Specific examples of the monofunctional monomer include nonylphenylcarbitol acrylate, 2-hydroxy-3-phenoxypropyl acrylate, 2-ethylhexylcarbitol acrylate, 2-hydroxyethyl acrylate and N-vinylpyrrolidone. Specific examples of the bifunctional monomer include 1,6-hexanediol di(meth)acrylate, ethylene glycol di(meth)acrylate, neopentyl glycol di(meth)acrylate, triethylene glycol di(meth)acrylate, bis(acryloyloxyethyl) ether of bisphenol A, 3-methylpentanediol di(meth)acrylate, and tricyclodecandimethanol di(meth)acrylate. Specific examples of the other polyfunctional monomer include trimethylol propane tri(meth)acrylate, pentaerythritol tri(meth)acrylate, pentaerythritol tetra(meth)acrylate, dipentaerythritol penta(meth)acrylate, dipentaerythritol hexa(meth)acrylate, and tris(methacryloyloxyethyl) isocyanurate. One of these photopolymerizable monomers (C) can be singly used or a combination of two or more of them can be used together. The amount of the photopolymerizable monomer (C) is generally 5 through 90 wt %, preferably 20 through 70 wt %, based on the content of all the solid components of the photosensitive coloring composition.

As the photopolymerizable monomer (C), a compound having a larger number of acrylic groups ($CH_2=CHCO-$) per unit weight of the compound, in other words, having a smaller acrylic group equivalent, which is represented by the weight in gram of the compound per one equivalent of the acrylic group, particularly a compound having an acrylic group equivalent of 100 or less, is preferred. In some cases, a monomer having such a small acrylic group equivalent can be used together with another monomer. When the monomer has a large acrylic group equivalent, sufficient sensitivity cannot be attained in exposing and developing a coat film obtained by using the monomer, thereby the productivity of the color filter lowers. For obtaining a compound having such a small acrylic group equivalent, a polyfunctional monomer having two or more functional groups is preferred. Examples of the monomer having an acrylic group equivalent of 100 or less include ethylene glycol diacrylate, trimethylol propane triacrylate, pentaerythritol triacrylate, pentaerythritol tetraacrylate and dipentaerythritol hexaacrylate. Among them, trimethylol propane triacrylate, pentaerythritol tetraacrylate and dipentaerythritol hexaacrylate are preferred.

The photopolymerization initiator (D) may be any of those generally used in this field and may be any of, for example, acetophenone, benzoin, benzophenone, thioxanthone and other initiators. Examples of the acetophenone initiator include oligomers of diethoxyacetophenone, 2-hydroxy-2-methyl-1-phenylpropane-1-on, benzyldimethylketal, 2-hydroxy-1-[4-(2-hydroxyethoxy)phenyl]-2-methylpropane-1-on, 1-hydroxycyclohexylphenylketone, 2-methyl-1-(4-methylthiophenyl)-2-morpholinopropane-1-on, 2-benzyl-2-dimethylamino-2-(4-morpholinophenyl)butane-1-on, and 2-hydroxy-2-methyl-1-[4-(1-methylvinyl)phenyl]propane-1-on. Examples of the benzoin initiator include benzoin, benzoin methyl ether, benzoin ethyl ether, benzoin isopropyl ether and benzoin isobutyl ether. Examples of the benzophenone initiator include benzophenone, o-benzoylbenzoic acid methyl, 4-phenylbenzophenone, 4-benzoyl-4'-methyldiphenylsulfide, 3,3',4,4'-tetra(tert-butylperoxycarbonyl)benzophenone and 2,4,6-trimethylbenzophenone. Examples of the thioxanthone initiator include 2-isopropylthioxanthone, 4-isopropylthioxanthone, 2,4-diethylthioxanthone, 2,4-dichlorothioxanthone and 1-chloro-4-propoxythioxanthone. Examples of other initiators include 2,4,6-trimethyl benzoyldiphenylphosphine oxide, 2,2'-bis(o-chlorophenyl)-4,4', 5,5'-tetraphenyl-1,2'-biimidazole, 10-butyl-2-chloroacridone, 2-ethylanthraquinone, benzyl, 9-10-phenanethrenequinone, camphorquinone, methyl phenylglyoxylate and a titanocene compound. One of these photopolymerization initiators can be singly used or a combination of two or more of them can be used together.

A photopolymerization initiator can be used in combination with a photoinitiation assistant. The photoinitiation assistant can be any of amines and alkoxy anthracene assistants. Specific examples thereof include triethanolamine, methyldiethanolamine, triisopropanolamine, methyl 4-dimethylaminobenzoate, ethyl 4-dimethylaminobenzoate, isoamyl 4-dimethylaminobenzoate, 4-dimethylaminobenzoic acid 2-ethylhexyl, benzoic acid 2-dimethylaminoethyl, N,N-dimethyl p-toluidine, 4,4'-bis(dimethylamino)benzophenone (so-called Michler's ketone), 4,4'-bis(diethylamino)benzophenone, 9,10-dimethoxyanthracene, 2-ethyl-9,10-dimethoxyanthracene, 9,10-diethoxyanthracene and 2-ethyl-9,10-diethoxyanthracene. One of these photoinitiation assistants can be singly used or a combination of two or more of them can be used together.

The amount of photopolymerization initiator (D) and the photoinitiation assistant, an optional element, in total is generally 3 through 50 parts by weight, preferably 5 through 40 parts by weight, on the basis of 100 parts by weight in total of the copolymer (B) and the photopolymerizable monomer (C).

The solvent (F) can be any of solvents used in this field. Specific examples thereof include esters such as methyl acetate, ethyl acetate, propyl acetate, isopropyl acetate, butyl acetate, isobutyl acetate, methyl propionate, ethyl propionate, propyl propionate, butyl propionate, ethyl pyruvate, 3-methoxy methylpropionate and 3-ethoxy ethylpropionate; ketones such as acetone, methyl ethyl ketone, methyl amyl ketone, diisobutyl ketone, cyclopentanone and cyclohexanone; glycol ether esters such as 3-methoxybutyl acetate and propylene glycol monomethyl ether acetate; and aromatic hydrocarbons such as benzene, toluene, and o-, m- and p-xylene. One of these solvents can be singly used or a combination of two or more of them can be used together. The amount of the solvent to be used is preferably 60 through 90 wt %, more preferably 70 through 85 wt %, based on the entire amount of the photosensitive coloring composition containing the same.

The photosensitive coloring composition of this invention may further contain, optionally, an additive such as a filler, another polymer compound, a surfactant, a pigment-dispersant, an adhesion accelerator, an antioxidant, a UV absorbent and an aggregation inhibitor. Examples of the filler include glass, silica and alumina. Examples of another polymer compound include polyvinyl alcohol, polyacrylic acid, poly(ethylene glycol) monoalkyl ether and polyfluoro alkyl acrylate. Examples of the surfactant and pigment-dispersant include various nonionic, cationic and anionic surfactants. Examples of the adhesion accelerator include vinyl trimethoxysilane, vinyl triethoxysilane, vinyl tri(2-methoxyethoxy)silane, N-(2-aminoethyl)-3-aminopopylmethyl dimethoxysilane, N-(2-aminoethyl)-3-aminopropyl trimethoxysilane, 3-aminopropyl triethoxysilane, 3-glycidoxypropyl trimethoxysilane, 3-glycidoxypropylmethyl dimethoxysilane, 2-(3,4-epoxycyclohexyl)ethyl trimethoxysilane, 3-chloropropylmethyl dimethoxysilane, 3-chloropropyl trimethoxysilane, 3-methacryloyloxypropyl trimethoxysilane and 3-melcaptopropyl trimethoxysilane. Examples of the antioxidant include 2,2'-thiobis(4-methyl-6-tert-butylphenol) and 2,6-di-tert-butyl-4-methylphenol.

Examples of the UV absorbent include 2-(3-tert-butyl-2-hydroxy-5-methylphenyl)-5-chlorobenzotriazole and alkoxybenzophenone. Examples of the aggregation inhibitor include sodium polyacrylate.

In the manufacture of the color filter of the present invention, the photosensitive coloring composition comprising the aforementioned components is used, in which the acid value of the nonvolatile component is adjusted within a range between 25 and 60 mg KOH/g. The acid value herein can be defined as the amount (mg) of potassium hydroxide required for neutralizing acid groups contained in 1 g of the nonvolatile component of the photosensitive coloring composition, namely, 1 g of the components excluding the solvent. This acid value is largely affected by a carboxyl group presented in the copolymer (B) but can also be affected by the other components. In particular, when a pigment-dispersant is used, the acid value is affected by the type of the used pigment-dispersant, and hence is generally determined through titration. The acid value can be adjusted, for example, by adjusting the amount of carboxyl group presented in the copolymer (B), which can be conducted by changing the copolymerization ratio of (meth)acrylic acid in producing the copolymer (B), considering the type of the used pigment-dispersant, etc.

When the acid value is too small, the solubility of the dried coat film formed from the photosensitive coloring composition in a developer is so low that the amount of the development residue is increased due to the low solubility. On the other hand, when the acid value is too large, a component to be dissolved is dissolved too much in the developer during the development and a remaining insoluble component appears as the development residue. In the both cases, a development residue is generated on the light-shielding layer and the transparent glass portion, resulting in lowering the adhesion and degrading the color reproducibility.

The photosensitive coloring composition can be prepared, for example, as follows:

The pigment (A) is previously mixed with the solvent (F) and is dispersed with a bead mill or the like until the pigment attains an average particle size of approximately 0.2 μm or less. At this point, a disperse agent is used if necessary, and part or all of the copolymer (B) can be mixed. To the obtained pigment disperse solution, the rest of the copolymer (B), the photopolymerizable monomer (C), the photopolymerization initiator (D), the other components used if necessary and an additional solvent if necessary are added so as to attain a predetermined concentration. Thus, the objective photosensitive coloring composition is obtained.

This photosensitive coloring composition preferably has viscosity at 25° C. of 3 through 20 mPa.s so that it can be applied on the surface of the substrate in a uniform thickness for forming a uniform dried coat film. Furthermore, it preferably has thixotropy within an appropriate range. Specifically, it has trixotropy of preferably 0.9 through 1.5. The thixotropy is represented by X/Y, wherein X is viscosity measured with an R-type viscometer at a rotor rotating speed of 5 rpm and Y is viscosity measured at a rotor rotating speed of 20 rpm. When the viscosity and the thixotropy are out of these ranges, a large thickness distribution and unevenness tend to be caused in coating the photosensitive coloring composition.

The photosensitive resin composition thus prepared is coated on a substrate to be formed into colored pixels through photo curing and development. The formation of colored pixels is conducted, for example, as follows:

First, the photosensitive resin composition is applied on a transparent substrate (glass in general) bearing a pattern of a light-shielding layer by using, for example, a bar coater, a spin coater and a resist-saving spin coater equipped with a slit. The resultant coat film is dried by heating (pre-bake) to give a flat dried coat film. At this point, the coat film has a thickness of generally 3 μm or less and preferably approximately 1 through 2 μm. The obtained coat film is irradiated with UV through a negative photomask for forming objective pixels. At this point, it is effective to use an apparatus such as a mask aligner so that an entire exposure portion can be uniformly irradiated with parallel rays and that the mask and the substrate can be accurately aligned. Thereafter, the coat film subjected to the photo curing is brought into a contact with an alkaline aqueous solution so as to dissolve an unexposed portion for development. Thus, the objective pixels can be obtained. After the development, post-curing (post-bake) can be carried out at 150 through 230° C. for approximately 10 through 60 minutes if necessary.

A developer used in the development conducted after the pattern exposure is an aqueous solution containing an alkaline compound and a surfactant in general. The alkaline compound can be any of inorganic or organic alkaline compounds. Specific examples of the inorganic alkaline compound include sodium hydroxide, potassium hydroxide, disodium hydrogenphosphate, sodium dihydrogenphosphate, diammonium hydrogenphosphate, ammonium dihydrogenphosphate, potassium dihydrogenphosphate, sodium silicate, potassium silicate, sodium carbonate, potassium carbonate, sodium hydrogencarbonate, potassium hydrogencarbonate, sodium borate, potassium borate and ammonia. Specific examples of the organic alkaline compound include tetramethylammonium hydroxide, 2-hydroxyethyltrimethylammonium hydroxide, monomethylamine, dimethylamine, trimethylamine, monoethylamine, diethylamine, triethylamine, monoiospropylamine, diisopropylamine and ethanolamine. One of these inorganic and organic alkaline compounds can be singly used or a combination of two or more of them can be used together. The concentration of the alkaline compound in the alkaline developer is preferably 0.01 through 10 wt % and more preferably 0.05 through 5 wt %.

The surfactant can be any of a nonionic surfactant, a cationic surfactant and an anionic surfactant. Specific examples of the nonionic surfactant include polyoxyethylene alkyl ether, polyoxyethylene aryl ether, polyoxyethylene alkyl aryl ether and other derivatives of polyoxyethylene, an oxyethylene/oxypropylene block copolymer, sorbitan fatty acid ester, polyoxyethylene sorbitan fatty acid ester, polyoxyethylene sorbitol fatty acid ester, glycerin fatty acid ester, polyoxyethylene fatty acid ester and polyoxyethylene alkylamine. Specific examples of the anionic surfactant include salts of higher alcohol sulfate ester such as lauryl alcohol sodium sulfate ester and oleyl alcohol sodium sulfate ester; alkyl sulfates such as lauryl sodium sulfate and lauryl ammonium sulfate; and salts of alkyl aryl sulfonate such as sodium dodecylbenzenesulfonate and sodium dodecylnaphthalenesulfonate. Specific examples of the cationic surfactant include amine salts such as stearyl amine hydrochloride and lauryltrimethyl ammonium chloride and quaternary ammonium salts. One of these surfactants can be singly used or a combination of two or more of them can be used together. The concentration of the surfactant in the alkaline developer is generally 0.01 through 10 wt %, preferably 0.05 through 8 wt % and more preferably 0.1 through 5 wt %.

Through these procedures of coating and drying of the photosensitive coloring composition, and pattern exposure and development of the dried coat film, pixels of a color corresponding to that of the pigment contained in the photosensitive coloring composition are formed. These procedures are repeated in the number of times corresponding to the number of colors required for the color filter, resulting in completing the color filter.

Figure 1B:
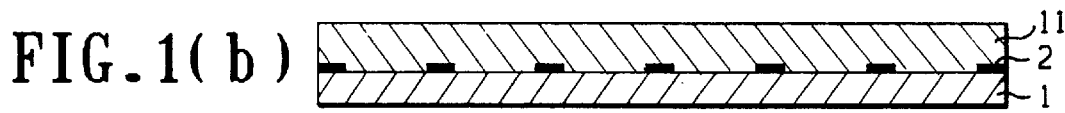
Figure 1C:
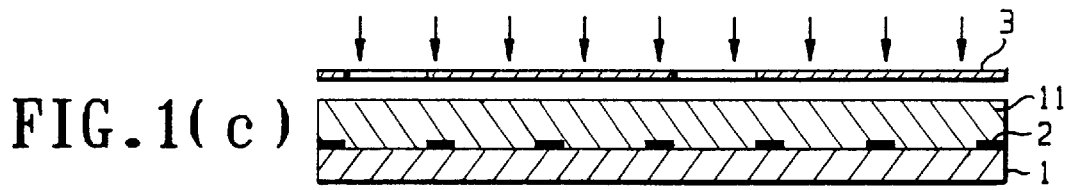
Figure 1D:
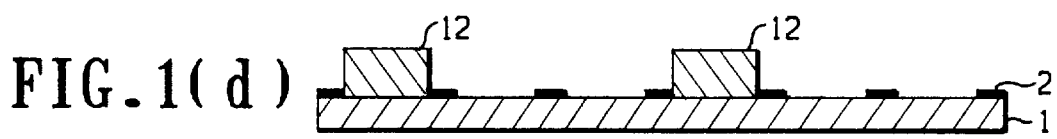
Figure 1E:
Figure 1F:
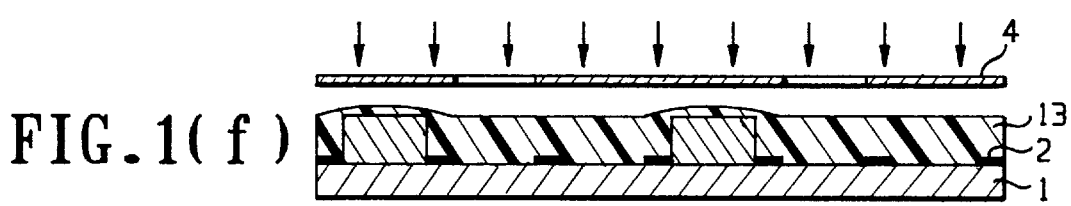
Figure 1G:
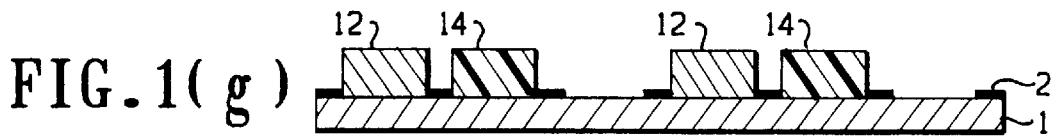
Figure 1H:
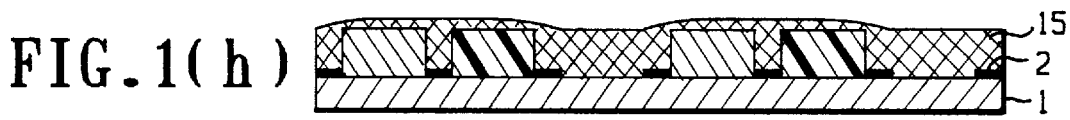
Figure 1I:
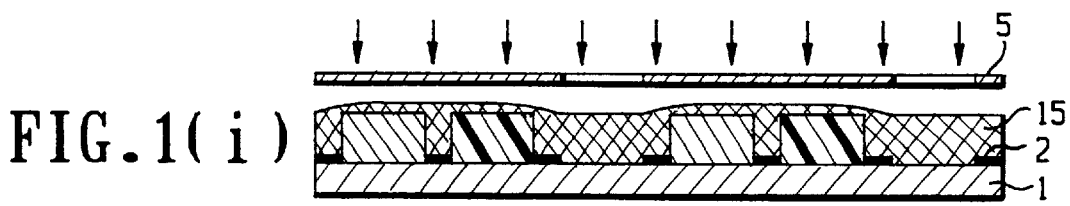
Figure 1J:
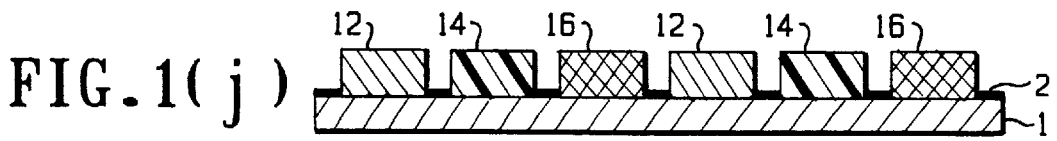

An example of such manufacturing procedures for a color filter will now be described with reference to schematic sectional views of FIG. 1. FIG. 1(a) shows a state where light-shielding layers 2 are formed on a transparent substrate 1. A photosensitive coloring composition corresponding to a first color is applied thereon and dried as shown in FIG. 1(b), thereby forming a first dried coat film 11. Next, as shown in FIG. 1(c), the substrate is irradiated through a photomask 3 with UV in a direction shown with arrows. In the coat film 11, a portion exposed to UV through the photomask 3 is cured to become alkali insoluble and an unexposed portion remains to be alkali soluble. Therefore, through the development with the coat film brought into a contact with an alkaline developer, first pixels 12 are formed as shown in FIG. 1(d). Next, as shown in FIG. 1(e), a photosensitive coloring composition corresponding to a second color is applied and dried, thereby forming a second dried coat film 13. The substrate is irradiated through a photomask 4 with UV in the direction shown with arrows, and the alkaline development is then carried out, thereby forming second pixels 14 as shown in FIG. 1(g). Furthermore, as shown in FIG. 1(h), a photosensitive coloring composition corresponding to a third color is applied and dried, thereby forming a third dried coat film 15. The substrate is irradiated through a photomask 5 with UV in the direction shown with arrows, and the alkaline development is then carried out, thereby forming third pixels 16 as shown in FIG. 1(j).

After forming the pixels of the respective colors through the development, the light-shielding layer 2 attains reflectance at 380 through 780 nm of 95% or more of the reflectance thereof before coating the photosensitive coloring composition, and the transparent portion of the transparent substrate 1 attains transmittance at 380 through 780 nm of 99.5% or more of the transmittance thereof before coating the photosensitive coloring composition. Herein, the reflectance at 380 through 780 nm of 95% or more means that the minimum reflectance at a wavelength of this range is not smaller than 95%. Similarly, the transmittance at 380 through 780 nm of 99.5% or more means that the minimum transmittance at a wavelength of this range is not smaller than 99.5%. In this manner, using the photosensitive coloring composition having an acid value of the nonvolatile component within the range specified in this invention, and using a generally used alkaline developer, the amount of the development residue remaining on the light-shielding layer and the transparent substrate can be reduced. Hence, the above-described reflectance of the light-shielding layer and transmittance of the transparent portion can be attained. Even after forming the pixels of the last color, namely, the third pixels 16 in the case of FIG. 1, a transparent portion in the outermost part of the transparent substrate remains, and the transmittance of this portion is measured.

A color filter generally includes pixels of red, green and blue arranged on a substrate. Therefore, the pixels of red, green and blue are formed on the substrate in a manner described above. The pixels of one color can be formed by carrying out the aforementioned procedures by using the photosensitive coloring composition of the present invention including a pigment corresponding to the color. Then, the same procedures are repeated by using the photosensitive coloring composition of the present invention including a pigment corresponding to another desired color. Thus, the pixels of the three colors can be arranged on the substrate. The present photosensitive coloring composition can be used with respect to merely one or two of the three colors. However, it is advantageous to apply the photosensitive coloring composition of the present invention to all the three colors. In this manner, the amount of the development residue remaining on both the light-shielding layer and the transparent portion of the substrate can be reduced and a color filter having good transparency is obtained. A liquid crystal display panel using this color filter can exhibit good performance.

EXAMPLES

Now, the present invention will be described in more details by way of examples. As a typical example, a blue photosensitive coloring composition was prepared to be coated on a substrate for evaluation, which does not limit the invention. In the following description, percentages and parts used as units of contents and use amounts are based on weight if not mentioned otherwise.

Example 1

A composition as shown in Table 1 was prepared. The acid value of a nonvolatile component, the viscosity and the thixotropy of the composition were measured as follows and the measured results are also listed in Table 1.

Acid value of nonvolatile component: The composition was diluted with acetone in an amount four times by weight. To the resultant, potassium hydroxide in ethanol in a concentration of 0.1 mol/liter was added dropwise, so as to measure the acid value by potentiometric titration.

Viscosity: The viscosity was measured with an R-type viscometer at a rotor rotating speed of 20 rpm.

Thixotropy: The thixotropy was represented by X/Y, in which X is the viscosity measured with the R-type viscometer at a rotor rotating speed of 5 rpm and Y is the viscosity measured at a rotor rotating speed of 20 rpm.

TABLE 1

| (A) Pigment | C.I. pigment blue 15:6 | 5.05 parts |
| --- | --- | --- |
| | C.I. pigment violet 23 | 0.17 part |
| (B) Binder resin | Benzylmethacrylate/methacrylic acid copolymer (weight composition ratio 80/20, weight-average molecular weight 43,000) | 5.77 parts |
| (C) Photopolymerizable monomer | dipentaerythitol hexaacrylate ("KAYARAD DPHA" available from Nippon Kayaku Co., Ltd.) | 5.77 parts |
| (D) Photopolymerization initiator | 2-methyl-1-(4-methylthiophenyl)-2-morphorinopropane-1-on ("IRGACURE 907" available from Ciba-Geigy Japan Limited.) | 0.77 part |
| | 2, 4-diethylthioxanthone ("KAYACURE DETX-S" available from Nippon Kayaku Co., Ltd.) | 0.38 part |
| (E) Additive | polymeric pigment-dispersant | 2.09 parts |
| (F) Solvent | propylene glycol monomethyl esther acetate | 80.00 parts |
| Acid value of nonvolatile component (mg KOH/g) | | 37.1 |
| Viscosity (mPa · s) | | 7.42 |
| Thixotropy | | 1.18 |

On a glass substrate (Corning #7059) bearing a light-shielding layer thereon which has a multilayer structure of chromium layer exposed on the surface and chromium oxide layer, the composition of Table 1 was applied with a spin coater. The resultant substrate was pre-baked at 70° C. for 3 minutes, thereby obtaining a dried coat film with a thickness of 1.2 μm. Subsequently, the dried coat film was subjected to exposure through a photomask by using an ultrahigh-pressure mercury lamp at 200 mJ/cm². Then, the resultant was immersed in a 0.8% sodium carbonate aqueous solution containing an anionic surfactant and was subsequently subjected to post-curing at 230° C. for 20 minutes. Thus, blue pixels were formed.

In a portion on the light-shielding layer from which the blue coat film was removed and in a transparent portion of the glass substrate (namely, unexposed portions of the substrate on which the blue pixels were thus formed), the reflectance of the portion on the light-shielding layer and the transmittance of the transparent portion were measured at a wavelength ranging between 380 nm and 780 nm with an evaluation system for a color filter for liquid crystal using an instant multiphotometry system "MCPD-1000" manufactured by Otsuka Electronics Co., Ltd., with the substrate before coating the composition used as a counter (100%). As a result, the reflectance of the portion on the light-shielding layer was 97.9% at minimum, and the transmittance of the transparent portion was 99.8% at minimum. On the both portions, the development residue was scarcely found, and a satisfactory result was thus obtained.

Examples 2–6 and Comparative Examples 1 and 2

Compositions were prepared in the same manner as in Example 1 except that the kinds and the amounts of binder resins and the amounts of the photopolymerizable monomer were changed as shown in Table 2, and the thus prepared compositions were similarly evaluated. The results are shown in Table 2 together with the amounts changed from those of Example 1. The photopolymerizable monomer used in these examples and comparative examples is dipentaerythritol hexaacrylate, the same as that used in Example 1. The used binder resins were the following three resins, which are referred to by using the following symbols:

(B) Binder resin:

BP1: Benzylmethacrylate/methacrylic acid copolymer (weight composition ration 80/20, weight-average molecular weight 43,000)

BP2: Benzylmethacrylate/methacrylic acid copolymer (weight composition ratio 82.7/17.3, weight-average molecular weight 40,000)

BP3: Benzylmethacrylate/methacrylic acid copolymer (weight composition ratio 85/15, weight-average molecular weight 42,000)

TABLE 2

|  | Examples | | | | | | Comparative example | |
| --- | --- | --- | --- | --- | --- | --- | --- | --- |
|  | 1 | 2 | 3 | 4 | 5 | 6 | 1 | 2 |
| (B) Binder resin | | | | | | | | |
| BP1 (parts) | 5.77 | 8.08 | — | — | — | — | 9.81 | — |
| BP2 (parts) | — | — | 5.77 | 8.08 | — | — | — | — |
| BP3 (parts) | — | — | — | — | 5.77 | 8.08 | — | 4.62 |
| (C) photopolymerizable | | | | | | | | |
| monomer (parts) | 5.77 | 3.46 | 5.77 | 3.46 | 5.77 | 3.46 | 1.73 | 6.92 |
| Acid Value (mg KOH/g) | 37.1 | 52.9 | 33.0 | 44.3 | 28.3 | 39.9 | 65.1 | 22.2 |
| Viscosity (mPa · s) | 7.42 | 8.97 | 7.08 | 7.54 | 6.97 | 7.31 | 0.61 | 6.32 |
| Thixotropy | 1.18 | 1.12 | 0.99 | 1.21 | 1.25 | 1.08 | 1.26 | 1.04 |
| Reflectance of light-shielding layer (%) | 97.9 | 97.1 | 97.5 | 98.3 | 95.1 | 97.6 | 66.7 | 77.2 |
| Transmittance of transparent portion (%) | 99.8 | 99.7 | 100.0 | 99.9 | 99.6 | 99.8 | 82.4 | 99.2 |

According to the present invention, the amount of development residue generated after developing pixels on a color filter can be reduced. Therefore, pixels of respective colors in the color filter can attain good color reproducibility, and lowering adhesion between a transparent electrode or an over coat stacked after forming the colored pixels and a substrate can be prevented. As a result, a color filter, and furthermore a liquid crystal display panel, can be manufactured in high yield.

What is claimed is:

1. A color filter comprising a transparent substrate, a light-shielding layer patterned on said transparent substrate, and colored pixels of plural colors patterned on a portion of said substrate where said light-shielding is not formed,
   wherein said colored pixels of at least one color are formed from a photosensitive coloring composition comprising:
   (A) a pigment;
   (B) a copolymer of (meth)acrylic acid and benzyl (meth)acrylate;
   (C) dipentaerythritol hexaacrylate;
   (D) a photopolymerization initiator; and
   (E) a solvent; and
   an acid value of a nonvolatile component of said photosensitive coloring composition is 25 through 60 mg KOH/g.

2. A method of manufacturing a color filter comprising a step of forming colored pixels by:
   coating a photosensitive coloring composition on a transparent substrate bearing light-shielding layer patterned thereon;
   drying said photosensitive coloring composition into a dried coat film;
   irradiating said dried coat film with light through a mask;
   developing said irradiated dried coat film to form the colored pixel;
   wherein said photosensitive coloring composition comprises:
   (A) a pigment;
   (B) a copolymer of (meth)acrylic acid and benzyl (meth)acrylate;
   (C) dipentaerythritol hexaacrylate;
   (D) a photopolymerization initiator; and
   (E) a solvent,
   a non volatile component of said photosensitive coloring composition has an acid value of 25 through 60 mg KOH/g.

3. The method of manufacturing a color filter according to claim 2, wherein, after forming said colored pixels, said light-shielding layer attains reflectance at 380 through 780 nm of 95% or more of reflectance thereof before coating said composition; and, after forming said colored pixels, a transparent portion of said substrate attains transmittance at 380 through 780 nm of 99.5% or more of transmittance thereof before coating said composition.

4. A photosensitive coloring composition comprising:

(A) a pigment;

(B) a copolymer of (meth)acrylic acid and benzyl (meth)acrylate;

(C) dipentaerythritol hexaacrylate;

(D) a photopolymerization initiator; and (E) a solvent; and an acid value of a nonvolatile component of said photosensitive coloring composition is 25 through 60 mg KOH/g.

5. The photosensitive coloring composition according to claim 4, wherein said photosensitive coloring composition has viscosity at 25° C. of 3 through 20 mPa•s.

6. The photosensitive coloring composition according to claim 5, wherein said photosensitive coloring composition has thixotropy represented by X/Y, in which X is viscosity measure with an R-type viscometer at a rotor rotating speed of 5 rpm and Y is viscosity measured at a rotor rotating speed of 20 rpm, of 0.9 through 1.5.

7. The photosensitive coloring composition according to claim 4, wherein said photosensitive coloring composition has thixotropy represented by X/Y, in which X is viscosity measured with an R-type viscometer at a rotor rotating speed of 5 rpm and Y is viscosity measured at a rotor rotating speed of 20 rpm, of 0.9 through 1.5.

* * * * *